United States Patent [19]
Uekubo

[11] Patent Number: 6,118,701
[45] Date of Patent: Sep. 12, 2000

[54] METHOD AND APPARATUS CAPABLE OF TRIMMING A NONVOLATILE SEMICONDUCTOR STORAGE DEVICE WITHOUT ANY SUPERFLUOUS PADS OR TERMINALS

[75] Inventor: Masaki Uekubo, Tokyo, Japan

[73] Assignee: NEC Corporation, Tokyo, Japan

[21] Appl. No.: 09/313,989

[22] Filed: May 19, 1999

[30] Foreign Application Priority Data

May 19, 1998 [JP] Japan .................................. 10-136878

[51] Int. Cl.⁷ .................................................. G11C 16/06
[52] U.S. Cl. .................................. 365/185.2; 365/185.21
[58] Field of Search ........................... 365/185.2, 185.21, 365/185.03, 185.24

[56] References Cited

U.S. PATENT DOCUMENTS

| | | | |
|---|---|---|---|
| 5,172,338 | 12/1992 | Mehrotra et al. ........................ | 365/185 |
| 5,386,388 | 1/1995 | Atwood et al. .......................... | 365/201 |
| 5,444,656 | 8/1995 | Bauer et al. ........................ | 365/189.01 |
| 5,654,919 | 8/1997 | Kwon .................................. | 365/185.21 |
| 5,717,640 | 2/1998 | Hashimoto .......................... | 365/189.07 |
| 5,757,697 | 5/1998 | Briner ................................. | 365/185.21 |
| 5,946,238 | 8/1999 | Campardo et al. .................. | 365/185.2 |
| 5,986,937 | 11/1999 | Yero .................................. | 365/185.21 |

*Primary Examiner*—Son Mai
*Attorney, Agent, or Firm*—Sughrue, Mion, Zinn, Macpeak & Seas, PLLC

[57] ABSTRACT

In a semiconductor storage device including a differential circuit which compares a voltage outputted by a memory cell array 103 with a voltage outputted by a reference circuit 106, a constant current source circuit 109 is connected to the differential circuit 201 in parallel with the memory cell array 103 and outputs a signal for monitoring the threshold voltage of the reference circuit 106. A controller circuit 108 is changed over from an output signal of the memory cell array 103 to that of the current source circuit 109 on monitoring the reference circuit.

13 Claims, 5 Drawing Sheets

METHOD AND APPARATUS CAPABLE OF TRIMMING A NONVOLATILE SEMICONDUCTOR STORAGE DEVICE WITHOUT ANY SUPERFLUOUS PADS OR TERMINALS

BACKGROUND OF THE INVENTION

The present invention relates to a nonvolatile semiconductor storage device, and more particularly, to a method and an apparatus for rapidly and accurately trimming the values stored by reference cells used for reading a memory cell array of a nonvolatile semiconductor storage device.

Generally, reference cells are used for fast reading together with a plurality of memory cells arranged in a memory cell array of a nonvolatile semiconductor storage device. Specifically, each memory cell stores a certain value to output a voltage corresponding to the certain value. Each output voltage is compared with a predetermined threshold level given by each of the reference cells to decide a logical value of each output voltage.

In order to avoid changing a difference of characteristics between a cell transistor of each memory cell and a reference cell transistor of a reference cell, it is preferable that the reference cell transistor for each reference cell has a characteristic identical with the memory cell transistor. When both the reference and the memory cells are identical with each other in characteristic, the threshold voltage of each reference cell usually corresponds to a voltage of the memory cells given when the transistors of the memory cells are turned on.

In a rewritable nonvolatile storage, such as a flash memory, the threshold voltage of the reference cell is not always kept at a desired level immediately after a diffusion process into a wafer. To set the threshold voltage of the reference cell at the desired level, several methods have been proposed.

By way of example, consideration might be made like in a UVPROM (ultraviolet erasable programmable read-only memory) about a method of irradiating ultraviolet rays onto both the memory and the reference cells to set the threshold voltage of each reference cell to a desired value.

However, the above method has the following disadvantages. Namely, it needs a step of irradiating ultraviolet rays, in spite of the fact that such a step is unnecessary for manufacturing a flash memory essentially. In addition, each cell device must be designed so that the threshold voltage of the reference cell is kept at the desired level after irradiation of the ultraviolet rays. Further, layers over a wiring layer must be structured so that ultraviolet rays can arrive at a reference cell portion.

In order to avoid those disadvantages, trimming operation of a threshold voltage of a reference cell is carried out by electrically erasing and programming. In this event, the threshold voltage of each reference cell should be monitored by using a routine, like a routine for automatically writing in a memory cell and a routine for automatic erasing.

Such a method and an apparatus for monitoring the threshold voltage of each reference cell are disclosed by Bauer et al in U.S. Pat. No. 5,444,656.

In FIG. 1, the apparatus mentioned in the above-mentioned patent is illustrated which has a memory cell array 103, a column switch 104, a current-to-voltage converter 240 of a sense amplifier, and a reference circuit 106.

More specifically, the memory cell array 103 has transistors 212 which are arranged in rows and columns. In FIG. 1, each of reference symbols WL0 to WLm shows a word line while each of reference symbols BL0 to BLm shows a bit line.

The illustrated column switch 104 is formed by transistors 210 which are driven by control signals YS0 and YSn.

The current-to-voltage converter circuit 240 of the sense amplifier is connected to the column switch 104 through a node DIGi and is formed by load transistor 202, 203 and an inverter 204. The circuit 240 converts a discharge current passing through the node DIGi to a voltage.

The reference circuit 106 has reference cells 231, transistors 230 which are driven by control signals YS0, YSR1 and YSR2, and a current-to-voltage converter circuit 241 which is formed by a load transistor 205, 206, and an inverter 207.

A reference voltage VREF which is sent from the reference circuit 106 is furnished to one input terminal of a differential amplifier 201. The amplifier 201 has another input terminal given a voltage VSA generated in a manner to be mentioned hereinafter.

An additional circuit is arranged between the amplifier 201 and the current-to-voltage converter circuit 240 of the sense amplifier. The additional circuit has transistors 404 driven by a controller 403, pads 401 externally connected to testing circuitry and connected directly to another input terminal of the amplifier 201, a digital-to-analog converter circuit 402, and a switch 405.

In the prior art illustrated in FIG. 1, the pads 401 are arranged to furnish the voltage VSA from a test probe or the like during trimming operation carried out in a manufacturing process. The voltage VSA is compared to the voltage VREF given from the reference circuit 106 by the amplifier 201 and a threshold value of the reference cell 231 is evaluated from the difference between the voltages VSA and VREF.

With this structure, however, the pads 401 must be arranged as external terminals in order to verify the threshold voltage of the reference cell 231. Moreover, one input terminal of the amplifier 201 is directly given the voltage VSA during the trimming operation on the side of the memory cell array 103 while another input terminal is connected through the current-to-voltage converter circuit 241 to the reference circuit 106. Consequently, the illustrated circuit is liable to be adversely affected by a variation caused to occur during a manufacturing process of the current-to-voltage converter circuit 241. Accordingly, precise control can not be realized.

SUMMARY OF THE INVENTION

It is, therefore, an object of the present invention to provide an improved method for monitoring each threshold voltage of reference cells in a nonvolatile semiconductor storage device.

It is another object of the present invention to provide an apparatus which is capable of carrying out precise trimming operation.

It is still another object of the present invention to provide an apparatus of the type described, which can dispense with superfluous pads to be connected to an external circuit.

According to this invention, a nonvolatile semiconductor storage device, which includes a memory cell array and a reference circuit, comprises a current source providing a constant current, a controller circuit which is connected to the memory cell array and the current source and which selects one output of the memory cell array and the current source, and a differential circuit which compares the output selected by said controller circuit with the output of said reference circuit.

In this device, the current source may comprise a plurality of current source circuits each of which corresponds to at least one memory cell of said memory cell array, wherein each of the current source circuits outputs a current different from each other.

In the above-mentioned device, the reference circuit may comprise a plurality of reference cells. In this device, each of the reference cells may be formed by at least one MOS transistor which has a drain, a source, and a gate. Furthermore, a gate voltage of each reference cell may be variable from each other.

The above-mentioned device may further comprise current-to-voltage converters converting output current values of the memory cell array and the reference circuit into voltage values, wherein said differential circuit compares said voltage values with each other. In this device, the differential circuit may comprise a differential amplifier. Also, in this device, one of said current-to-voltage converters may be connected between said differential circuit and said controller circuit, and another one of said current-to-voltage converter is connected between said differential circuit and said reference circuit.

In the above-mentioned device, the differential circuit may be compare the output current of said memory cell array with the output current of said reference circuit. In this device, the differential circuit comprises a current mirror circuit. Also, in this device, the current source comprises a plurality of current source circuits each of which corresponds to at least one memory cell of the memory cell array, wherein each of the current source circuits outputs a current different from each other.

In the above-mentioned device, the current source may be controllably connected in parallel with the memory cell array.

According to this invention, a method, which trims a nonvolatile semiconductor memory device, comprises preparing the nonvolatile semiconductor memory device which has a memory cell array, a reference circuit, a differential circuit, and a constant current source controllably connected in parallel with the memory cell array, selecting the constant current source instead of the memory cell array to connect the constant current source to the differential circuit connected to the reference circuit, and comparing outputs of the constant current source and the reference circuit with each other to trim the reference circuit.

DESCRIPTION OF THE PREFERRED EMBODIMENTS

Next, description will be made about a nonvolatile semiconductor storage device according to each embodiment of the invention in reference to drawings.

First Embodiment

The present invention enables to precisely monitor each threshold voltage of reference cells of a nonvolatile semiconductor storage device that is electrically programmable and erasable. Herein, it is to be noted that monitoring each threshold voltage of the reference cells is executed to detect each threshold voltage of the reference cells before and after programming and erasing the cells in a process for trimming each threshold voltage of the cells.

Figure 2:
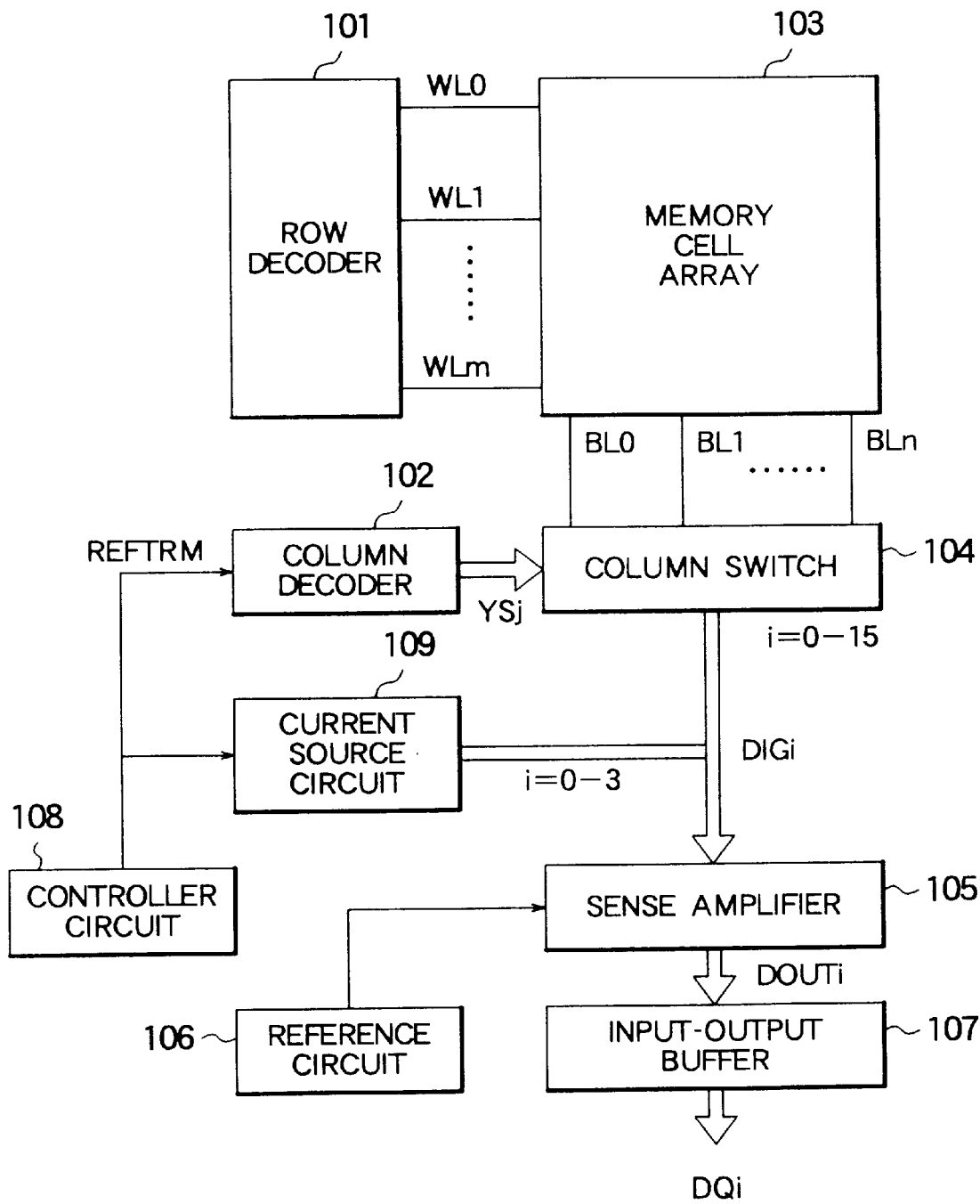
FIG. 2 shows a block diagram for use in describing a part of a nonvolatile semiconductor storage device according to an embodiment of the present invention.

As shown in FIG. 2, the present invention is applied to the nonvolatile semiconductor storage device comprising a sense amplifier 105 which compares an output of a memory cell array 103 with that of a reference circuit 106. In addition to these components, the illustrated device according to the present invention comprises a constant current source circuit 109 and a controller circuit 108.

The constant current source circuit 109 is connected to the sense amplifier 105 in parallel with the reference circuit 106 and outputs a standard threshold signal which gives a standard value of threshold voltage to be set in the reference cells 231. The controller circuit 108 is operable to switch, from one to another, outputs of the memory cell array 103 and the current source circuit 109 which are arranged in parallel. Furthermore, the input terminals of the differential circuit 201 (FIG. 3) are connected to the current-to-voltage converter circuits 240 and 241 that are symmetric with respect to the differential circuit 201.

The memory cell array 103 and the constant current source circuit 109 are arranged in parallel with respect to the sense amplifier 105. The differential circuit 201 decides a difference between a current value that the current source circuit 109 outputs and a current value which the reference circuit 106 outputs. As a result, it is possible to monitor a threshold voltage value of the reference circuit 106.

In the above mentioned storage device, 4 data lines (i=0–3) of all of data lines (i=0–15) are used. When the number of lines utilized increases, it is possible to increase the variety of the current value outputted by the constant current source circuit 109 and to get more information.

Next, description will be made about the above-mentioned device with reference to both of FIGS. 2 and 3 more in detail.

As shown in FIG. 2, the nonvolatile semiconductor storage device of the present invention has the memory cell array 103, the reference circuit 106, the sense amplifier 105 connected to the memory cell array 103 through the column switch 104, the constant current source circuit 109, and the controller circuit 108.

Figure 3:
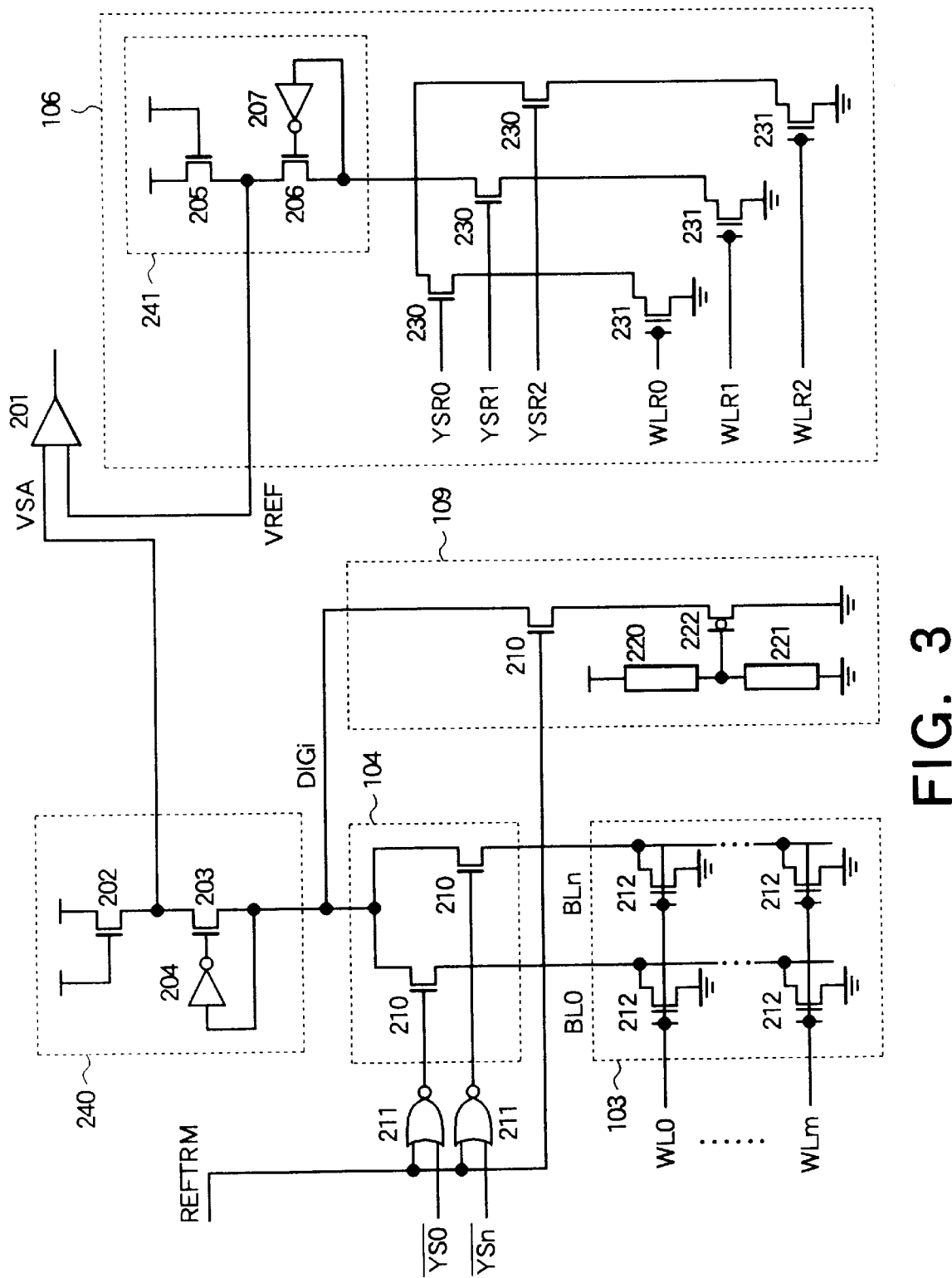
FIG. 3 shows a circuit diagram for use in describing a part of the nonvolatile semiconductor storage device illustrated in FIG. 2.

As shown in FIG. 2 and FIG. 3, the memory cell array 103 has the memory cells or transistors 212. The word lines WL0–WLm of the memory cell array 103 are connected to the row decoder 101 (FIG. 2) and the bit lines BL0–BLm are connected to the column switch 104. As shown in FIG. 3, the column switch 104 is formed by transistors 210 that have the bases connected to NOR circuits 211. Input terminals of the NOR circuits 211 are given a signal REFTRM from the column decoder 102 shown in FIG. 2 and inverted control signals YS0 and YSn.

The current-to-voltage converter circuit 240 of the sense amplifier 105 is connected to the column switch 104 and a node DIGi and has load transistors 202, 203 and an inverter 204. The current-to-voltage circuit 240 converts a discharge current passing through the node DIGi to a voltage. Moreover, the output terminal of the sense amplifier 105 is connected to the input-output buffer 107 shown in FIG. 2.

The reference circuit 106 includes reference cells 231 driven by signals through word lines WLR0, WLR1 and WLR2, transistors 230 driven by control signals YSR0, YSR1 and YSR2, and a current-to-voltage converter circuit 241. Furthermore, the current-to-voltage converter circuit 241 has load transistors 205, 206 and an inverter 207.

As shown in FIG. 3, the differential circuit 201 is structured by a differential amplifier. One input terminal of the circuit 201 is given a voltage VREF (reference voltage) from the reference circuit 106, and another input terminal is given a voltage VSA from the current-to-voltage converter circuit 240.

In usual operation of the sense amplifier 105, for example, read operation for reading the memory cell array according to a user's operation, the voltage VSA which corresponds to a current outputted by the memory cell 212 and the VREF by the reference cell 231 are given to the differential circuit 201.

The differential circuit 201 has a gain decided by the current-to-voltage converter circuits 240, 241. A characteristic of the gain depends on a characteristic between drain current and source-drain voltage.

When both the load transistors 202 and 205 have identical electric characteristics with each other, the differential circuit 201 outputs a result of simple comparison between the output current of the memory cell 212 and that of the reference cell 231.

When the load transistors 202, 205 have different electric characteristics from each other and are composed of the same type transistors having widths and lengths of their gates different from each other, a ratio of currents passing through the memory cell 212 and the reference cell 231 is given on current comparison.

Moreover, as shown in FIGS. 2 and 3, the memory cell array 103 and the column switch 104 are connected in a series to each other to form a series circuit. The series circuit and the current source circuit 109 are connected in parallel to the node DIGi. The constant current source circuit 109 is driven by the signal REFTRM generated by the controller circuit 108. As shown in FIG. 3, the constant current source circuit 109 has a transistor 210 driven by the signal REFTRM generated by the controller circuit 108, a current source 222, and voltage dividers 220 and 221.

According to the embodiment, a discharge path through the node DIGi is selected by the signal REFTRM given from the controller circuit 108.

When the signal REFTRM is low in level, the illustrated constant current source circuit 109 is separated electrically from the node DIGi and discharge is carried out through the node DIGi by the memory cell 212.

When the signal REFTRM is high in level, the column switch 104 is put into a non-selected state to be disconnected from the memory cell 212 and, instead, the constant current source circuit 109 is selected to be connected to the node DIGi. At this time, the differential circuit 201 compares the voltage VSA with the reference VREF. As a result, it is possible to compare a current outputted by the current source circuit 109 with a current discharged by the reference cell 231.

Next, an operation of the above-mentioned embodiment will be described more in detail.

The sense amplifier 105 generates a high level signal DQi when the current of the reference cell 231 is greater than that of the memory cell 212. On the contrary, the sense amplifier 105 generates a low level signal DQi when the current of the reference cell 231 is smaller than the current of the memory cell 212.

Each threshold voltage of the reference cells 231 can be measured by monitoring the signal DQi sent from the input-output buffer 107 when the reference cells 231 are driven by the currents given through the word lines WLR0 to WLR2 connected to the gates of the reference cells in a wafer selecting process.

Figure 4:
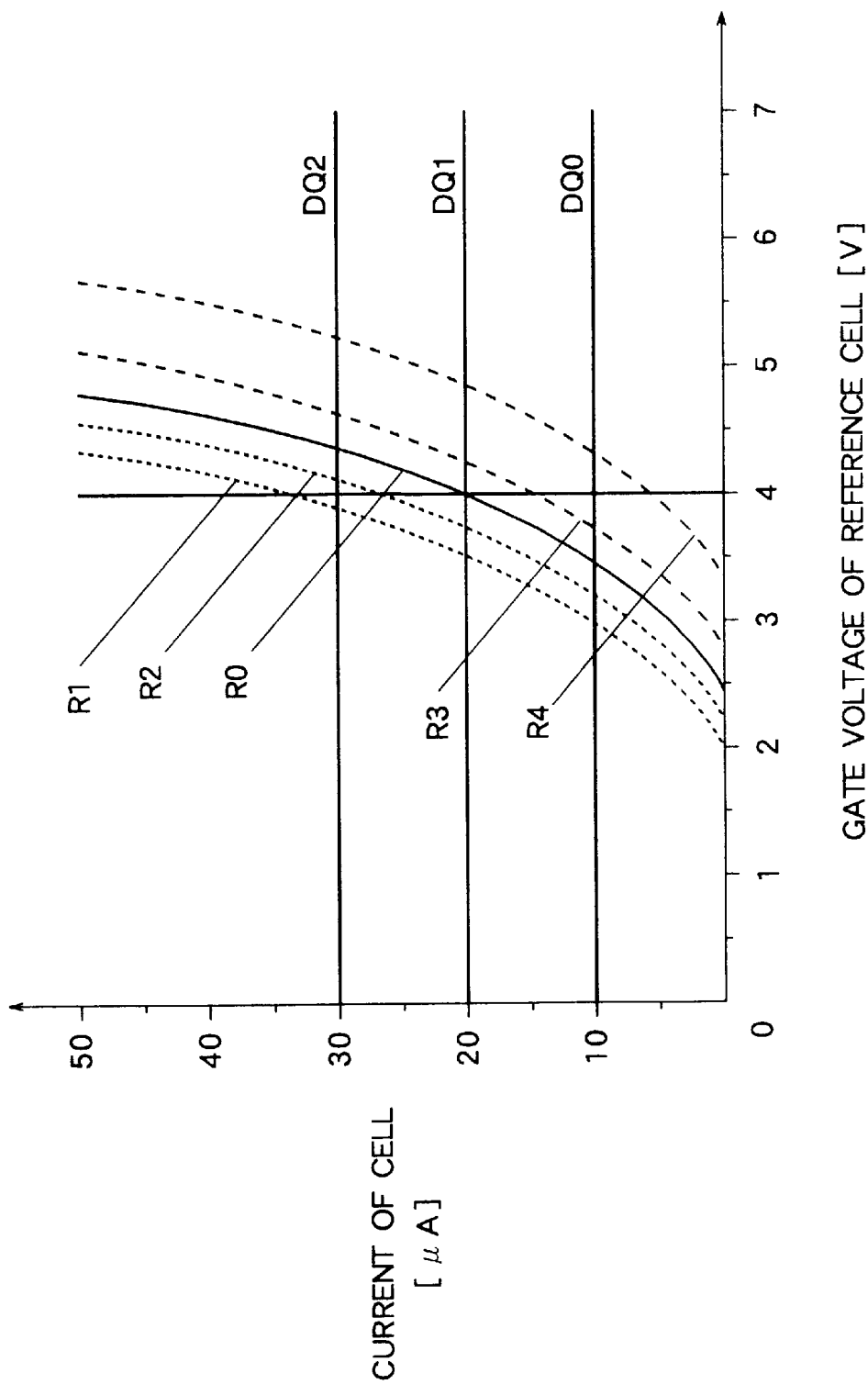
FIG. 4 shows a diagram illustrating voltage/current conditions of reference cells illustrated in the array of FIG. 2.

Referring to FIG. 4, the operation of the circuit shown in FIGS. 2 and 3 will be described.

In FIG. 4, a state R0 is assumed to be a target state of the threshold voltage of the reference cell 231. In comparison with the state R0, states R1 and R2 show states which need write-in operation while states R3 and R4 show states which need erasing operation. The state R1 needs to be written deeper than the state R2 while the state R4 needs to be erased deeper than the state R3.

The constant current source circuit 109 discharges different currents to each of the sense amplifiers 105. In the case of FIG. 4, there are a plurality of the sense amplifiers 105 and these output signal DQ0, DQ1 and DQ2 are different from one another. The sense standard currents of the sense amplifiers 105 are set to 10 $\mu$A, 20 $\mu$A and 30 $\mu$A in accordance with the signals DQ0, DQ1, and DQ2, respectively.

When the DQ0, DQ1 and DQ2 are assigned from a lower significant bit, outputs from the input-output buffer 107 in the states R1, R2, R3 and R4 are represented by 0H, 4H, 6H and 7H. As a result, this embodiment can classify selection of either writing or erasing and a pulse length or an applied voltage on writing or erasing into a plurality of stage in accordance with the outputs of sense amplifiers 105.

Second Embodiment

Next, description will be made about the second embodiment of the present invention.

On applying the present invention to a multi-valued memory, which stores more than two values, the multi-valued memory needs to include a plurality of reference cells 231.

It is necessary to control threshold voltages of the reference cells 231 included in a multi-valued memory with high precision in comparison with the binary memory mentioned in FIGS. 2 and 3. To achieve higher precision, the second embodiment shown in FIG. 5 includes a plurality of current source circuits 301, 302, . . . and 30$n$ in parallel, instead of one current source circuit 222 as shown in FIG. 3. Thus, combinations of reference cells with current source circuits serve to compare output currents with each other.

Figure 5:
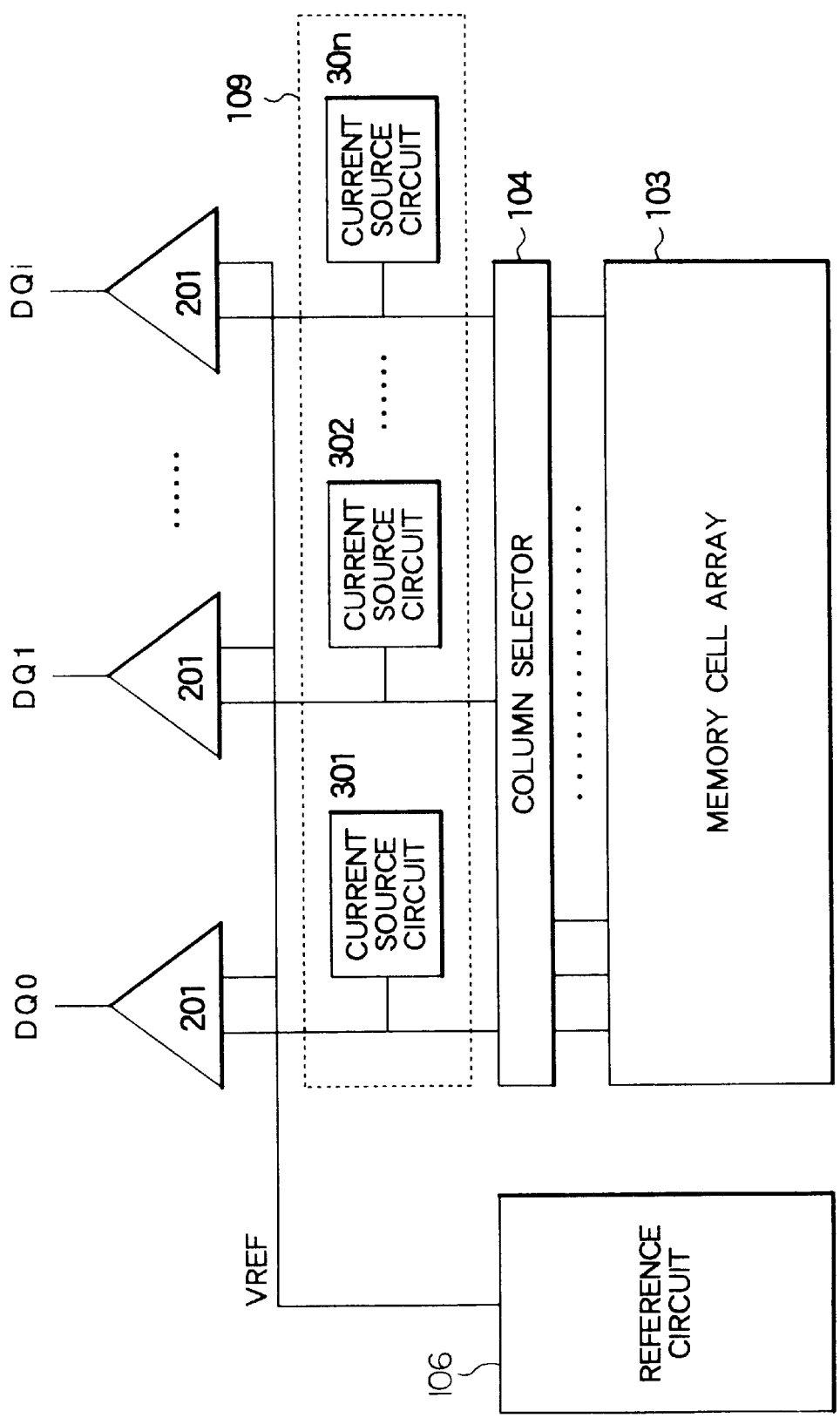
FIG. 5 shows a block diagram for use in describing a part of a nonvolatile semiconductor storage device according to another embodiment of the present invention.

As shown in FIG. 5, the second embodiment of the present invention provides current source circuits 109, each of which outputs different current value in accordance with each of sense amplifiers 109 in a nonvolatile semiconductor storage device. Therefore, this embodiment has advantages that the threshold voltages of the reference cells 106 are monitored for short time, and each of reference cells may be set to different threshold voltages from one another.

Consequently, a trimming method of the second embodiment according to the present invention is advantageous in that the threshold voltage of the reference cell is monitored precisely even if the device includes a plurality of reference cells.

In the above description, it is assumed that both the load transistors 202 and 205 of the current-to-voltage converter circuits 240 and 241 have equal resistance. In this case, the differential circuit 201 outputs the result of simply comparing the current of reference cell with that of memory cell. However, a change of the resistance ratio between the load transistors provides an effect equivalent to a change of the current of the current source circuit 109.

The current source circuits 301, 302, . . . and 30$n$ each of which is given a different value from one another as shown in FIG. 5 serve to adjust the threshold voltage to a desired one of various values on one hand. On the other hand, adjustment of the gate voltage values of the reference cells (WLR0 to WLR2) serves to monitor a threshold voltage of a reference cell like that mentioned above.

The voltages of the word lines WLR0 to WLR2 of the reference cell 231 may be generated by an inner circuit or may be given from an external circuit through new or existing outer terminals. In the latter case, the voltages may be varied.

Further, the above-mentioned embodiments have been restricted to the nonvolatile semiconductor device which includes a differential circuit for comparing the voltage of each memory cell array with that of each reference cell. However, the present invention is not restricted to those embodiments. The present invention is generally applicable to a device including a differential circuit which compares a voltage of a memory cell array with that of a reference cell. In this case, the differential circuit has a current mirror circuit to compare currents of the memory cell array and the reference circuit with each other, and load transistors of current-to-voltage converter circuits may be formed by transistors of different conductive types utilized in FIG. 2.

Figure 1:
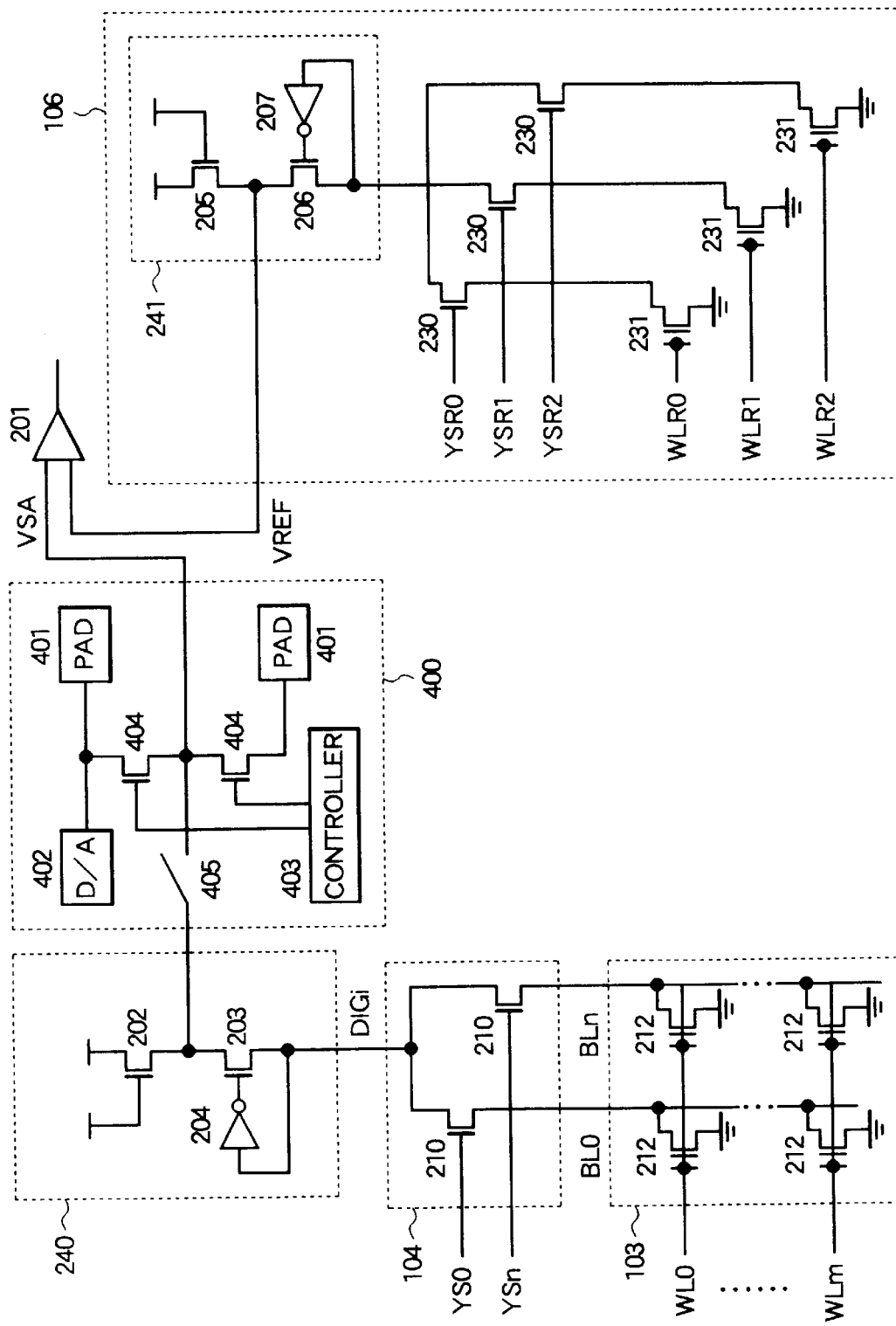
FIG. 1 shows a circuit diagram for use in describing a part of a conventional nonvolatile semiconductor storage device.

The present invention provides a device that includes a constant current source for providing a standard of comparison with currents of reference cells. Because of this, the device enables to monitor threshold voltages of reference cells by only switching over the connection between memory cells and reference cells to the connection between current sources and reference cells. As a result, the device of the present invention need not include outer terminals for inputting a standard signal like the conventional device illustrated in FIG. 1.

Moreover, although it is difficult to manufacture sense amplifiers with uniform quality, the present invention has a structure that current-to-voltage converter circuits are connected to the differential circuit in parallel so that the device of the present invention is hardly affected by various quality.

Moreover, the present invention is applicable to a device wherein comparison may be made about either voltages or currents sent from the memory cell array and the reference cells.

While the present invention has thus far been described in conjunction with a few embodiments thereof, it will be readily possible for those skilled in the art to put the present invention into various other manners.

What is claimed is:

1. A nonvolatile semiconductor storage device including a memory cell array and a reference circuit, comprising:

a current source providing a constant current;

a controller circuit which is connected to the memory cell array and the current source and which selects one output of the memory cell array and the current source; and a differential circuit which compares the output selected by said controller circuit with the output of said reference circuit.

2. A device as claimed in claim 1, wherein the current source comprises a plurality of current source circuits each of which corresponds to at least one memory cell of said memory cell array, wherein each of the current source circuits outputs a current different from each other.

3. A device as claimed in claim 1, wherein the reference circuit comprises a plurality of reference cells.

4. A device as claimed in claim 3, wherein each of the reference cells is formed by at least one MOS transistor which has a drain, a source, and a gate.

5. A device as claimed in claim 4, wherein a gate voltage of each reference cell is variable from each other.

6. A device as claimed in claim 1, further comprising current-to-voltage converters converting output current values of the memory cell array and the reference circuit into voltage values, wherein said differential circuit compares said voltage values with each other.

7. A device as claimed in claim 6, wherein said differential circuit comprises a differential amplifier.

8. A device as claimed in claim 6, wherein one of said current-to-voltage converters is connected between said differential circuit and said controller circuit, and another one of said current-to-voltage converter is connected between said differential circuit and said reference circuit.

9. A device as claimed in claim 1, wherein said differential circuit compares the output current of said memory cell array with the output current of said reference circuit.

10. A device as claimed in claim 9, wherein said differential circuit comprises a current mirror circuit.

11. A device as claimed in claim 9, wherein the current source comprises a plurality of current source circuits each of which corresponds to at least one memory cell of the memory cell array, wherein each of the current source circuits outputs a current different from each other.

12. A device as claimed in claim 1, wherein the current source is controllably connected in parallel with the memory cell array.

13. A method of trimming a nonvolatile semiconductor memory device, comprising:

preparing the nonvolatile semiconductor memory device which has a memory cell array, a reference circuit, a differential circuit, and a constant current source controllably connected in parallel with the memory cell array;

selecting the constant current source instead of the memory cell array to connect the constant current source to the differential circuit connected to the reference circuit; and comparing outputs of the constant current source and the reference circuit with each other to trim the reference circuit.

* * * * *